United States Patent
Kim et al.

(10) Patent No.: US 7,078,955 B2
(45) Date of Patent: Jul. 18, 2006

(54) TEMPERATURE SENSING CIRCUIT AND METHOD

(75) Inventors: Kwang-hyun Kim, Seoul (KR); Chan-Kyung Kim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 25 days.

(21) Appl. No.: 10/884,684

(22) Filed: Jul. 2, 2004

(65) Prior Publication Data

US 2005/0001670 A1    Jan. 6, 2005

(30) Foreign Application Priority Data

Jul. 4, 2003    (KR) ............... 10-2003-0045411

(51) Int. Cl.
*H01L 35/00* (2006.01)
(52) U.S. Cl. .................................... 327/512
(58) Field of Classification Search ........... 327/512, 327/513
See application file for complete search history.

(56) References Cited

U.S. PATENT DOCUMENTS

| | | | |
|---|---|---|---|
| 6,091,255 A | 7/2000 | Godfrey | 324/760 |
| 6,363,490 B1 * | 3/2002 | Senyk | 713/300 |
| 6,489,831 B1 * | 12/2002 | Matranga et al. | 327/512 |
| 6,567,763 B1 * | 5/2003 | Javanifard et al. | 702/130 |
| 6,683,489 B1 * | 1/2004 | Eker | 327/538 |
| 2002/0133789 A1 | 9/2002 | Hsu et al. | 716/4 |

FOREIGN PATENT DOCUMENTS

| | | |
|---|---|---|
| JP | 08-289463 | 11/1996 |
| JP | 10-318849 | 12/1998 |

* cited by examiner

*Primary Examiner*—My-Trang Nu Ton
(74) *Attorney, Agent, or Firm*—Marger Johnson & McCollom, P.C.

(57) ABSTRACT

A temperature sensing circuit and method are provided. An example temperature sensing circuit includes a temperature sensing unit that outputs a temperature signal indicating whether the temperature in the semiconductor device is higher or lower than a reference temperature in response to a first current control signal or a second current control signal by using a first current level that is increased when the temperature rises and a second current level that is reduced when the temperature rises. The temperature sensing unit also includes a storage unit that stores and outputs the temperature signal, and a controller that changes the first current level or the second current level in response to the temperature signal output from the storage unit and generates the first current control signal or the second current control signal used to control the reference temperature.

34 Claims, 8 Drawing Sheets

<INCREASE IN CTAT>

TEMPERATURE SENSING CIRCUIT AND METHOD

BACKGROUND OF THE INVENTION

This application claims priority from Korean Patent Application No. 2003-45411, filed on Jul. 4, 2003, the disclosure of which is incorporated herein in its entirety by reference.

1. Field of the Invention

This disclosure relates to a temperature sensing circuit, and more particularly, to a temperature sensing circuit in which the temperature in a semiconductor device is sensed.

2. Description of the Related Art

A conventional thermal sensor senses the temperature in a semiconductor device and outputs the sensed result only as a 'high' or 'low' level.

For example, a thermal sensor designed to sense a predetermined reference temperature outputs a 'high' level when a present temperature in a semiconductor device is higher than the predetermined reference temperature, and outputs a 'low' level when the present temperature in the semiconductor device is lower than the predetermined reference temperature.

Thus, in order to sense temperature in the semiconductor device accurately, a plurality of thermal sensors would be required. For example, in order to sense a temperature in the semiconductor device where the operating temperature range of the semiconductor device is 100° C. and an accuracy of 1° C. is desired, 99 thermal sensors are needed.

FIG. 1 illustrates an operating principle of a conventional thermal sensor. A conventional thermal sensor uses two currents, CTAT and PTAT. CTAT is generated by applying a forward bias to a P-N junction and has a characteristic that the magnitude of the current decreases as temperature increases. PTAT is generated by applying a forward bias to a P-N junction and has the characteristic that the magnitude of the current increases as temperature increases.

The two currents PTAT and CTAT, having inverse characteristics, are applied to input terminals of a comparator (not shown). For example, the current PTAT is applied to a positive terminal of the comparator (not shown), and the current CTAT is applied to a negative terminal of the comparator (not shown). Then, the output of the comparator (not shown) is observed.

Referring to FIG. 1, when the temperature is below a reference temperature REFT, the current CTAT is larger than the current PTAT, and the comparator (not shown) outputs a low level. When the temperature is higher than REFT, the current PTAT is larger than the current CTAT, and the comparator (not shown) outputs a high level.

The temperature at which the two currents PTAT and CTAT intersect is the reference temperature REFT. The reference temperature REFT may be arbitrarily set by a designer when the designer designs the thermal sensor.

Thus, by observing the output of the comparator (not shown), whether the present temperature in the semiconductor device is higher or lower than the reference temperature REFT can be determined. However, the conventional thermal sensor indicates only whether the present temperature in the semiconductor device is higher or lower than the reference temperature REFT. It cannot sense the temperature in the semiconductor device with any greater accuracy.

Embodiments of the invention address these and other limitations of the prior art.

SUMMARY OF THE INVENTION

Embodiments of the invention provide a temperature sensing circuit that accurately senses the temperature in a semiconductor device, digitizes the sensed temperature, and outputs the result.

Embodiments of the invention also provide temperature sensing methods by which the temperature in a semiconductor device is accurately sensed and the sensed result is digitalized and output.

BRIEF DESCRIPTION OF THE DRAWINGS

The above and other aspects and advantages of the present invention will become more apparent by describing in detail exemplary embodiments thereof with reference to the attached drawings.

DETAILED DESCRIPTION OF THE INVENTION

Figure 1:
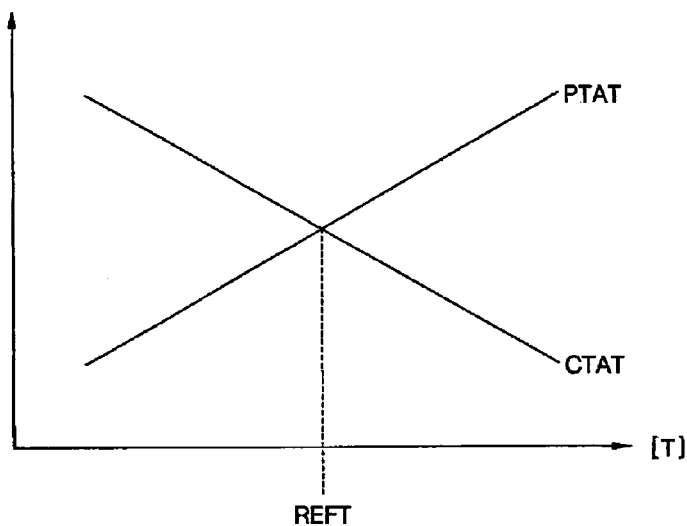
FIG. 1 illustrates an operating principle of a conventional thermal sensor.

Embodiments of the present invention will be described in detail with reference to the accompanying drawings. Like reference numerals refer to like elements throughout the figures.

Figure 2:
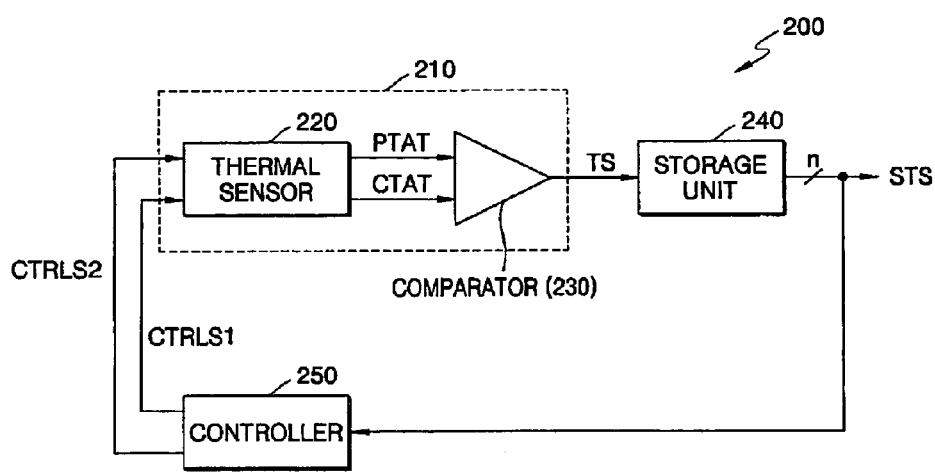
FIG. 2 is a block diagram illustrating a temperature sensing circuit according to an embodiment of the present invention.

FIG. 2 is a block diagram illustrating a temperature sensing circuit according to an embodiment of the invention. Referring to FIG. 2, a temperature sensing circuit 200 includes a temperature sensing unit 210, a storage unit 240, and a controller 250.

The temperature sensing unit 210 outputs a temperature signal TS having information on whether the temperature in a semiconductor device is higher or lower than a reference temperature REFT in response to a first current control signal CTRLS 1 or a second current control signal CTRLS2. When the temperature rises, a first current level PTAT is increased and a second current level is CTAT reduced.

More specifically, the temperature sensing unit 210 includes a thermal sensor 220 and a comparator 230.

The thermal sensor 220 changes the first current level PTAT in response to the first current control signal CTRLS1 and changes the second current level CTAT in response to the second current control signal CTRLS2, effectively changing the reference temperature REFT.

The comparator 230 compares the first current PTAT and the second current CTAT, the outputs from the thermal sensor 220, and generates the temperature signal TS that has a first level or a second level.

The storage unit 240 stores and outputs the temperature signal TS. The controller 250 generates the first current control signal CTRLS1 or the second current control signal CTRLS2 in response to the temperature signal TS output from the storage unit 240. This changes the first current level PTAT or the second current level CTAT and thereby controls the reference temperature REFT.

The temperature sensing circuit 200 according to embodiments of the present invention changes the reference temperature REFT of the thermal sensor 220 automatically using a successive approximation register (SAR) algorithm, thereby sensing temperature in the semiconductor device very accurately.

For example, when the temperature sensing circuit 200 senses a present temperature using the SAR algorithm, the temperature sensing circuit 200 reduces a difference between the reference temperature REFT and the temperature gradually through successive approximations. Eventually the temperature is sensed with improved accuracy.

Hereinafter, the operating principle of the temperature sensing circuit 200 using the SAR algorithm according to embodiments of the present invention will be described with reference to FIG. 3.

Figure 3:
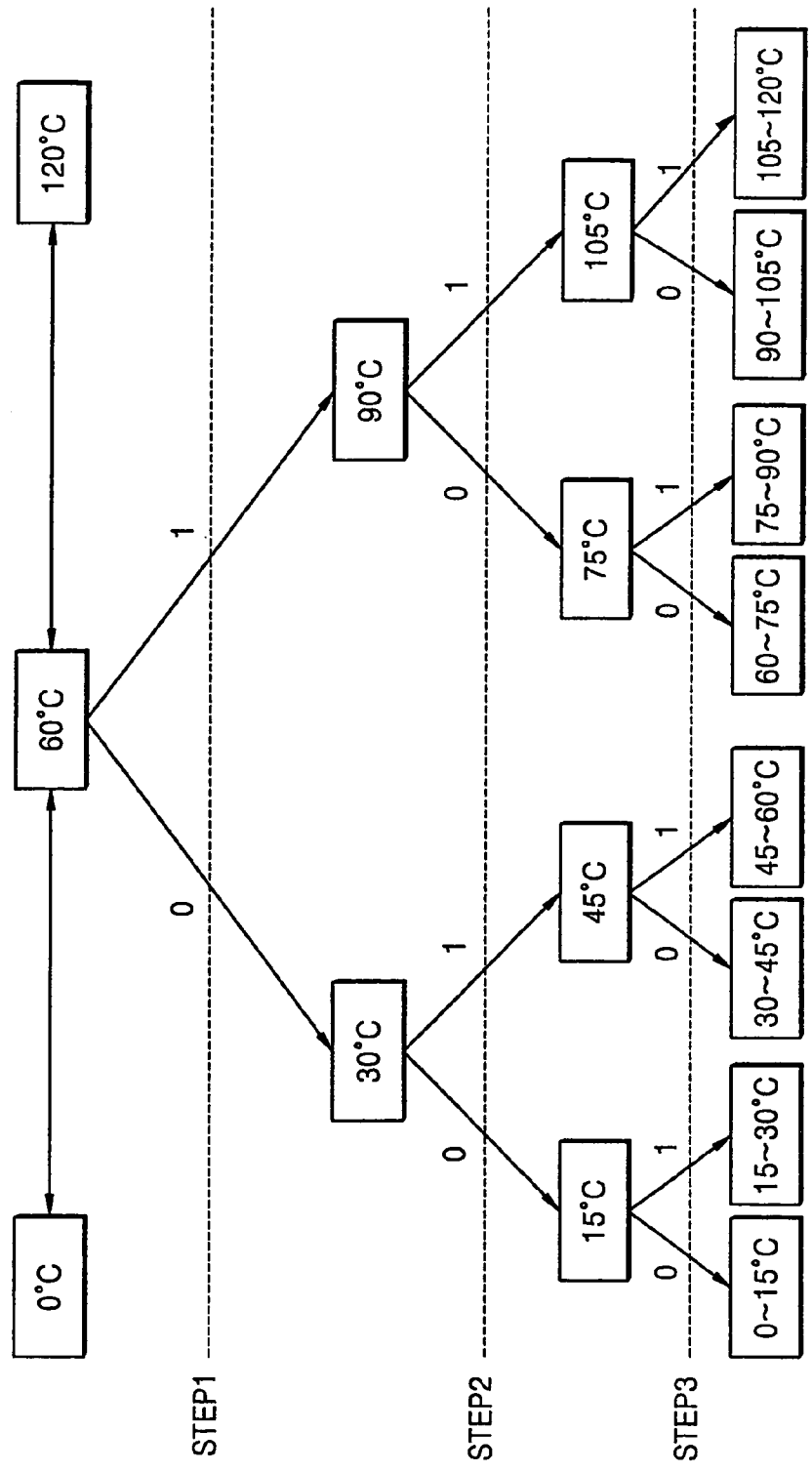
FIG. 3 is a chart that illustrates a method of sensing a current temperature by the temperature sensing circuit of FIG. 2 according to an embodiment of the present invention using a successive approximation register algorithm.

FIG. 3 illustrates a method of sensing a current temperature by the temperature sensing circuit of FIG. 2 according to an embodiment of the invention using the successive approximation register (SAR) algorithm.

Various SAR algorithms have been used in analog to digital (A/D) converters. An initial output, that is, the output temperature signal TS of the comparator 230 of the temperature sensing unit 210, is stored in a most significant bit (MSB) latch (not shown) of the storage unit 240. Then, the temperature signal TS stored in the MSB latch (not shown) is applied to the controller 250. Next, the controller 250 changes the reference temperature REFT of the thermal sensor 220 using the first current control signal CTRLS1 or the second current control signal CTRLS2.

The thermal sensor 220 senses a present temperature based on the changed reference temperature REFT again, and the comparator 230 outputs the sensed temperature as a new temperature signal TS. The new temperature signal TS is stored in a second latch (not shown) of the storage unit 240.

In this way, the temperature in the semiconductor device can be accurately sensed by n comparisons of the comparator 230 and stored in n latches (not shown) inside the storage unit 240.

For example, assuming that the operating temperature range of the semiconductor device (not shown) is between 0° C. and 120° C., an initial reference temperature REFT of the thermal sensor 220 is set to a middle temperature of 60° C. Assuming that a present temperature in the semiconductor device is 70° C., an initial output of the reference temperature TS of the comparator 230 is a high level and is stored in the MSB latch (not shown).

The stored temperature signal TS is used by the controller 250 to control the thermal sensor 220. The reference temperature REFT of the thermal sensor 220 is changed to 90° C., a value approximately midway between the initial temperature of 60° C. and the maximum value of the operating temperature range of the semiconductor device, 120° C.

Next, the comparator 230 compares the assumed temperature of 70° C. in the semiconductor device to the newly reset reference temperature REFT of 90° C. and determines that the present temperature 70° C. is less than the REFT of 90° C., thus, the comparator outputs the temperature signal TS as a low level, and stores the output temperature signal TS in a second latch (not shown) of the storage unit 240.

The newly stored temperature signal TS is used by the controller 250 to control the thermal sensor 220, and to change the reference temperature REFT of the thermal sensor 220 to 75° C., a value approximately midway between 90° C. and 60° C.

By repeating this method an appropriate number of times (n times), the temperature in the semiconductor device can be accurately sensed, and the sensed temperature can be output as a digital output.

As described herein, a new value of the reference temperature REFT is set approximately mid-way between the previous value of the reference temperature REFT and a temperature limit on one side of the reference temperature REFT. For example, if the present temperature in the semiconductor is lower than the current reference temperature REFT, the next reference temperature REFT is set approximately mid-way between the previous value of the reference temperature REFT and a temperature limit lower than the present temperature in the semiconductor. It will be understood by those skilled in the art that the new value of the reference temperature REFT can be set anywhere between the previous value of the reference temperature REFT and the temperature limit.

Like the example shown in FIG. 3, if the operating temperature range of the semiconductor device is 0–120° C. and the temperature in a semiconductor chip is sensed in units of 1° C., seven latches (not shown) should be provided to the storage unit 240, and the temperature sensing unit 210 should be operated seven times. Thus, by varying the number of iterations performed and the number of latches used, embodiments of the invention can be implemented to accurately sense temperatures over any temperature range to any desired level of accuracy.

Figure 4:
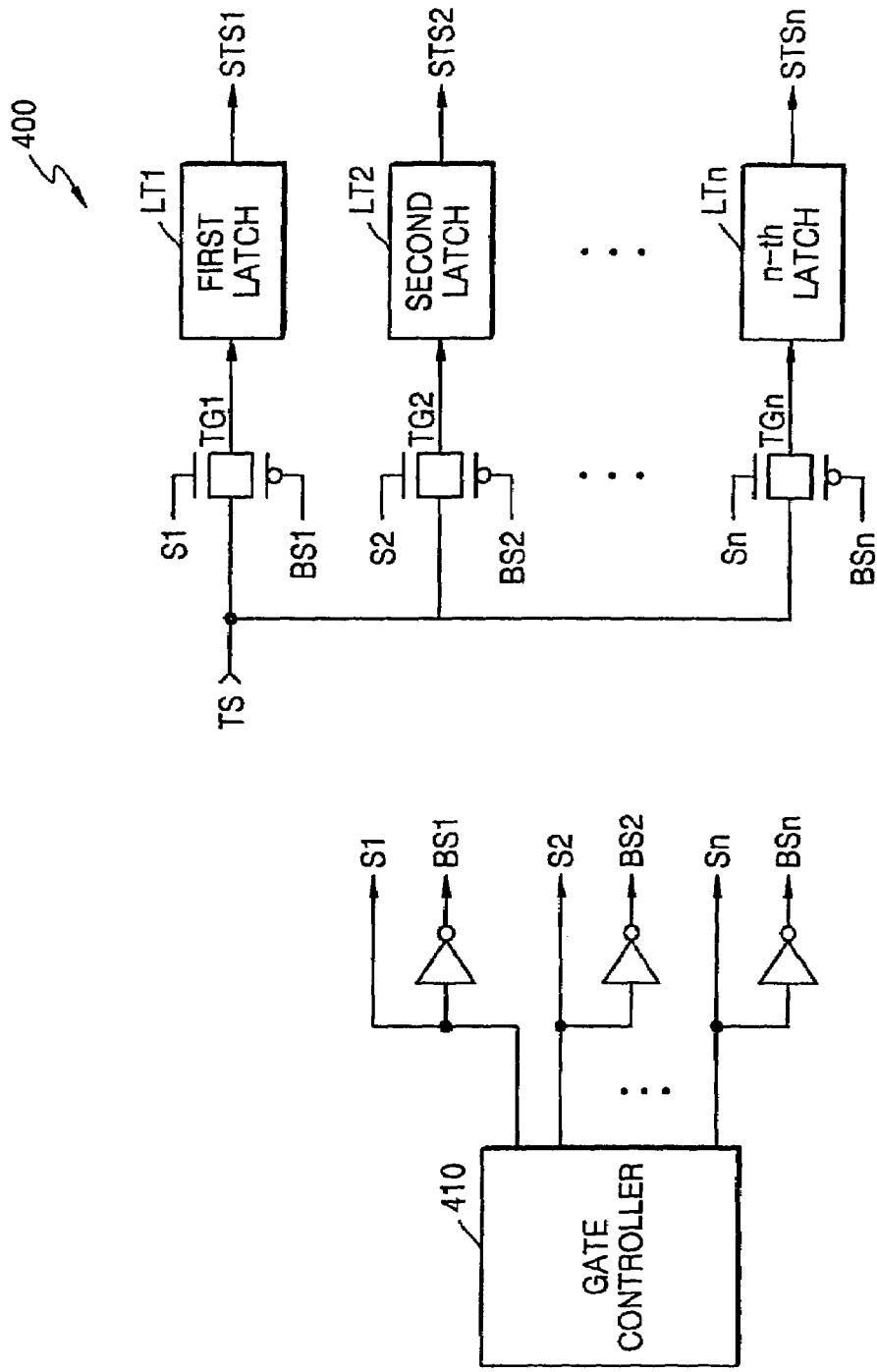
FIG. 4 is a circuit diagram of an example storage unit of FIG. 2.

FIG. 4 is a circuit diagram of a storage unit of FIG. 2.

Figure 5:
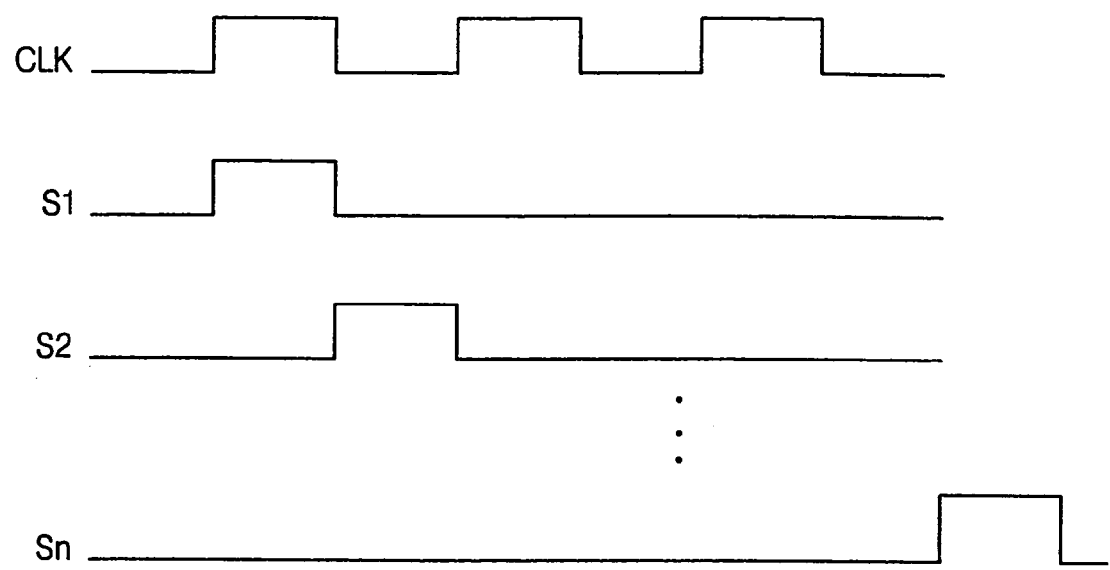
FIG. 5 is a waveform diagram of first through n-th gate control signals output from a gate controller of FIG. 4.

FIG. 5 is a waveform diagram of first through n-th gate control signals output from a gate controller of FIG. 4.

Referring to FIGS. 4 and 5, the storage unit 240 includes first through n-th latches LT1, LT2, . . . , and LTn for storing the temperature signal TS, first through n-th transmission gates TG1, TG2, . . . , and TGn for transmitting the temperature signal TS to the first through n-th latches LT1, LT2, . . . , and LTn, and a gate controller 410.

The gate controller 410 generates first through n-th gate control signals S1, S2, . . . , and Sn or BS1, BS2, . . . , and BSn used to turn on or turn off the first through n-th transmission gates TG1, TG2, . . . , and TGn.

As described previously, the temperature signal TS is sequentially stored in the first through n-th latches LT1, LT2, . . . , and LTn whenever the temperature signal TS is output from the temperature sensing unit 210. The first through n-th latches LT1, LT2, . . . , and LTn output the stored temperature signal TS to the controller 250.

For example, if the first gate control signal S1 or B1 is used to turn on the first transmission gate TG1, a present temperature that is initially sensed by the temperature sensing unit 210 and output as a temperature signal TS is stored in the first latch LT1.

While the first transmission gate TG1 is turned on, the other transmission gates TG2, . . . , and TGn are turned off. Referring to FIG. 5, activation periods of the first through n-th gate control signals S1, S2, . . . , and Sn or BS1, BS2, . . . , and BSn do not overlap with one another. Thus, in the first through n-th transmission gates TG1, TG2, . . . , and TGn, a previous transmission gate is turned on, turned off, and then a next transmission gate is turned on.

A temperature signal STS stored in the first latch LT1 is applied to the controller 250, and the controller 250 outputs a first current control signal CTRLS1 or a second current control signal CTRLS2 and controls the thermal sensor 220 of the temperature sensing unit 210. As a result, the reference temperature REFT is changed. The operation of the controller 250 will be described below.

The temperature sensing unit 210 senses a present temperature based on the changed reference temperature REFT, and the sensed result is output as the temperature signal TS. Then, the second gate control signal S2 or BS2 is used to turn on the second transmission gate TG2, and the new temperature signal TS output by the temperature sensing unit 210 is stored in the second latch LT2.

The temperature signal STS stored in the second latch LT2 is applied to the controller 250, and the controller 250 outputs a first current control signal CTRLS1 or a second current control signal CTRLS2 and controls the thermal sensor 220 of the temperature sensing unit 210. Then the reference temperature REFT is changed again. In this way, the storage unit 240 transmits the temperature signal TS to the controller 250.

If temperature sensing is performed n times, the temperature signal STS output from the storage unit 240 will be an n-bit digital signal. A user can accurately determine the present temperature in the semiconductor device from the n-bit digital signal accurately.

Figure 6:
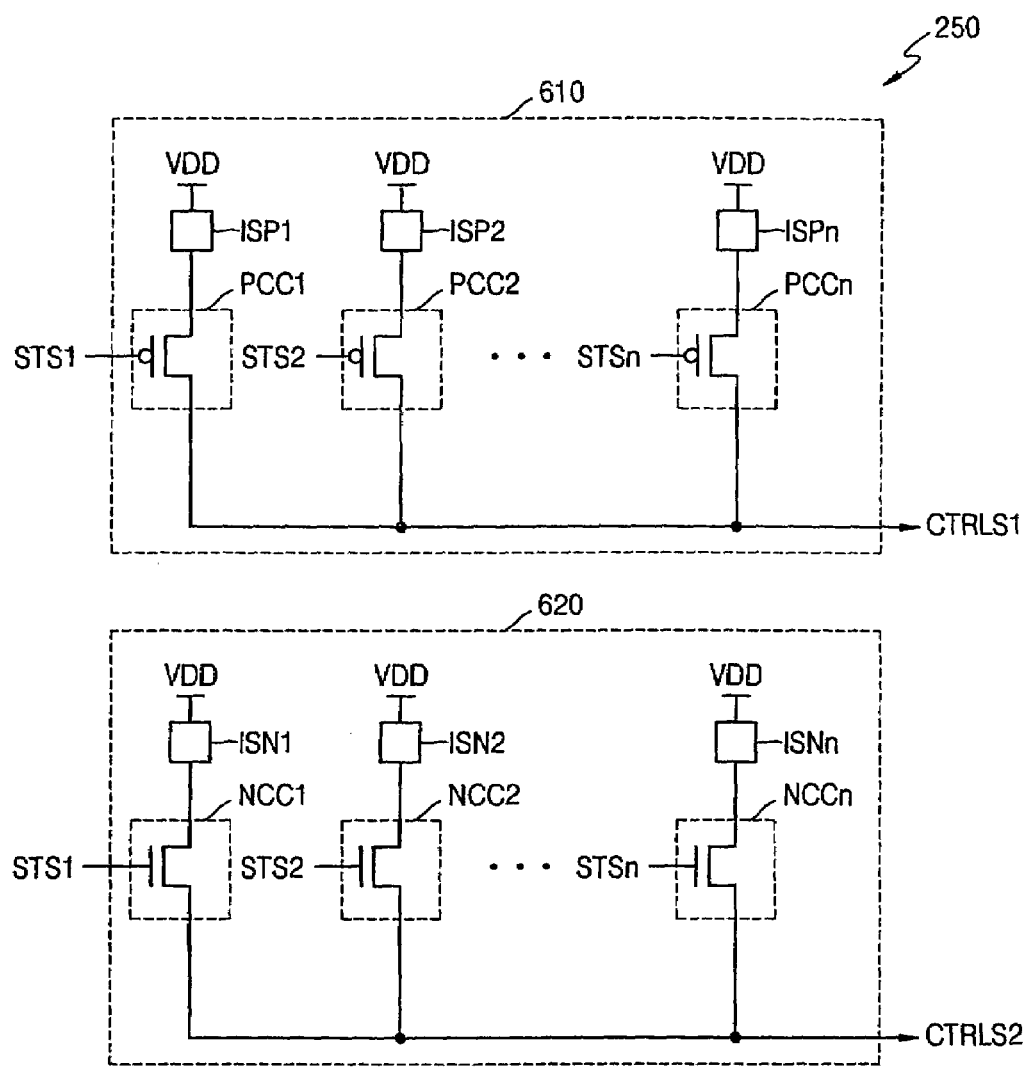
FIG. 6 is a circuit diagram of an example controller of FIG. 2.

FIG. 6 is a circuit diagram of an example controller of FIG. 2.

Figure 7:
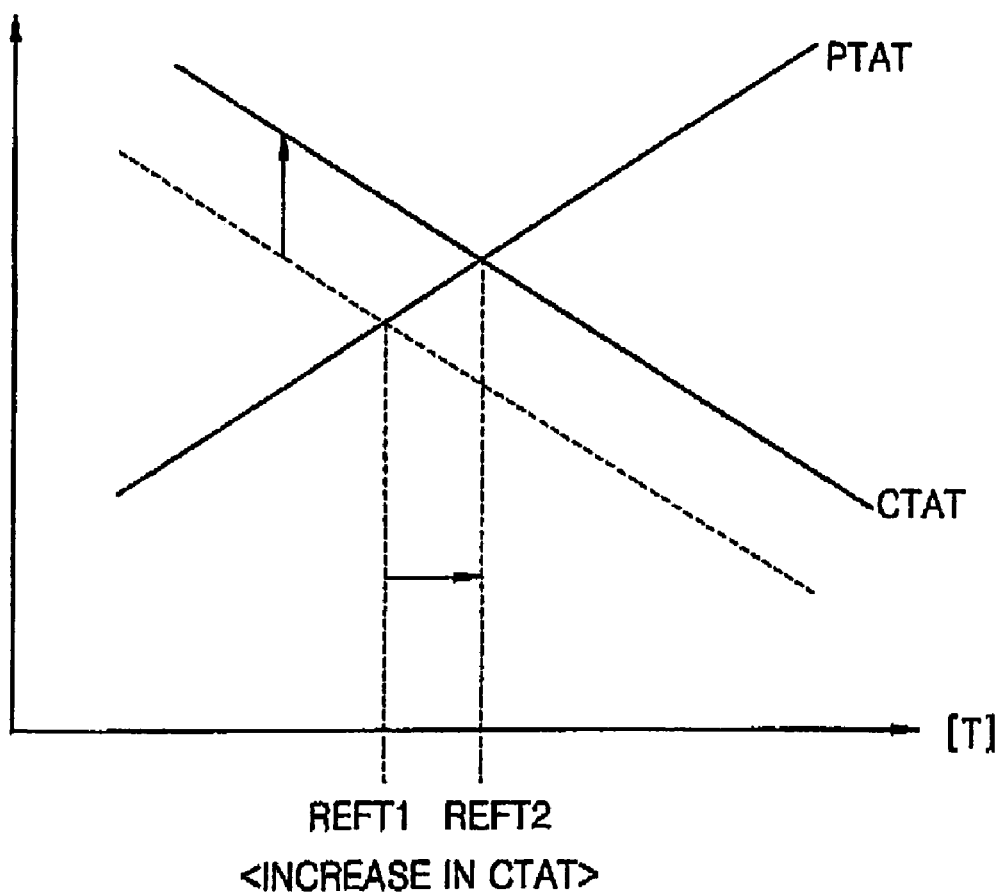
FIG. 7 is a graph that illustrates a principle of reducing a reference temperature by increasing the amount of a first current.

FIG. 7 is a graph that illustrates a principle of reducing a reference temperature by increasing the amount of a first current.

Figure 8:
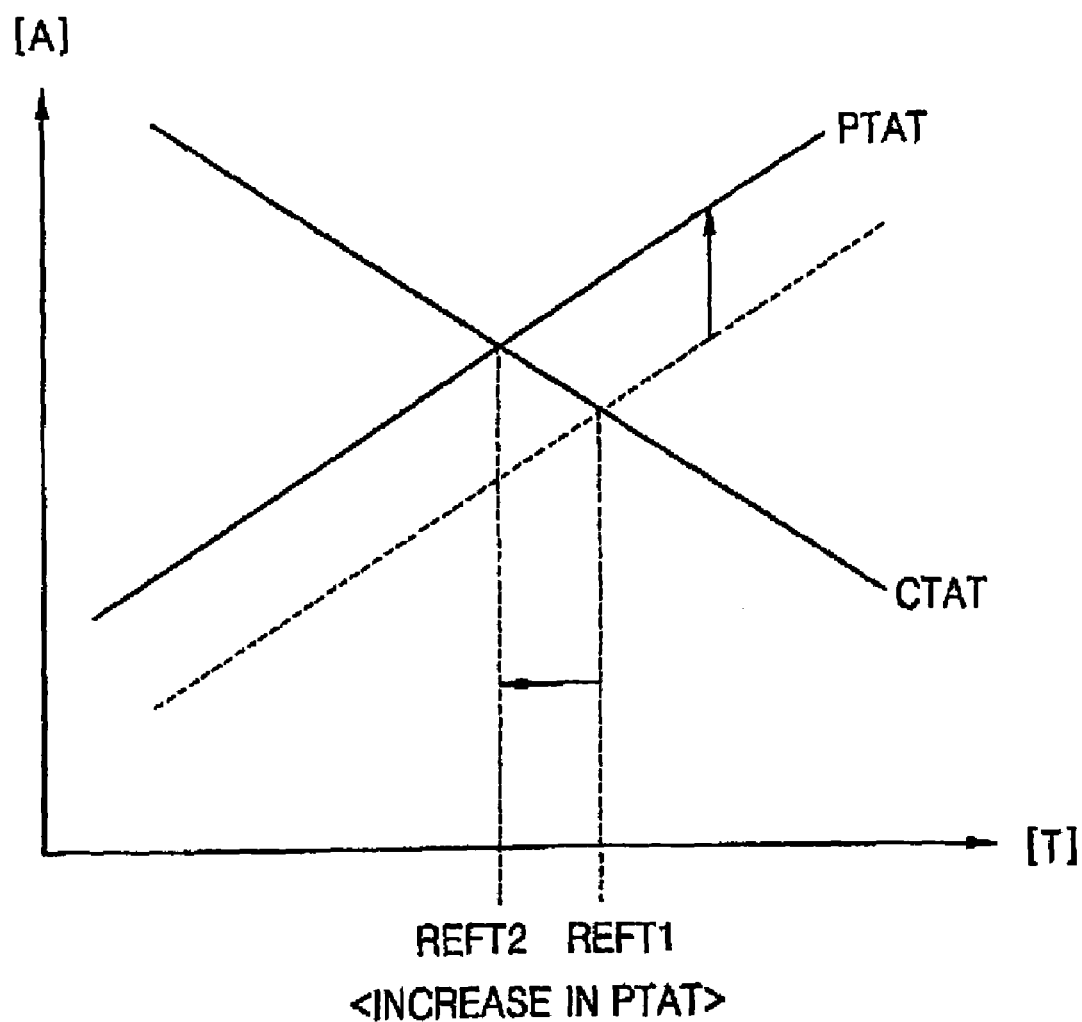
FIG. 8 is a graph that illustrates a principle of increasing a reference temperature by increasing the amount of a second current.

FIG. 8 is a graph that illustrates a principle of increasing a reference temperature by increasing the amount of a second current.

An example controller 250 of FIG. 6 includes a first current control signal generating portion 610 and a second current control signal generating portion 620. The first current control signal generating portion 610 generates a first current control signal CTRLS1 in response to the temperature signal STS output from the storage unit 240.

The second current control signal generating portion 620 generates a second current control signal CTRLS2 in response to the temperature signal STS output from the storage unit 240. The amount of current of the first current control signal CTRLS1 and the second current control signal CTRLS2 changes in response to the temperature signal STS.

The first current control signal generating portion 610 includes first through n-th positive current amount controlling parts PCC1, PCC2, . . . , and PCCn for controlling the amount of current of the first current control signal CTRLS1 in response to the corresponding temperature signal STS.

Each of the first through n-th positive current amount controlling parts PCC1, PCC2, . . . , and PCCn can be formed from a PMOS transistor that has a first end connected to a power supply, a gate to which the corresponding part of the temperature signal STS is applied, and a second end through which the first current control signal CTRLS1 is output.

The first current control signal generating portion 610 may further include first through n-th positive current sources ISP1, ISP2, . . . , and ISPn. The first through n-th positive current sources ISP1, ISP2, . . . , and ISPn can adjust the amount of current that flows through the corresponding positive current control part. This will adjust the amount of the first current control signal CTRLS1 non-uniformly.

The second current control signal generating portion 620 includes first through n-th negative current amount controlling parts NCC1, NCC2, . . . , and NCCn for controlling the amount of current of the second current control signal CTRLS2 in response to the corresponding temperature signal STS.

Each of the first through n-th negative current amount controlling parts NCC1, NCC2, . . . , and NCCn can be formed from an NMOS transistor that has a first end connected to a power supply, a gate to which the corresponding part of the temperature signal STS is applied, and a second end through which the second current control signal CTRLS2 is output.

The second current control signal generating portion 620 may further include first through n-th negative current sources ISN1, ISN2, . . . , and ISNn. The first through n-th negative current sources ISN1, ISN2, . . . , and ISNn can adjust the amount of current that flows through the corresponding negative current control part. This will adjust the amount of the second current control signal CTRLS2 non-uniformly.

Like the previous example, assuming that temperature in the semiconductor device is 70° C., the initial reference temperature REFT is 60° C., the comparator 230 outputs the temperature signal TS that has a high level. The high-level temperature signal is stored in the first latch LT1. The temperature signal STS stored in the first latch LT1 is referred to as STS1 for convenience. The temperature signal STS1 is applied to the first current control signal generating portion 610 and the second current control signal generating portion 620 of the controller 250.

If the first positive current amount controller PCC1 is a PMOS transistor, it is not affected by the high-level temperature signal STS1. Differently, if the first negative current amount controller NCC1 is an NMOS transistor, the first negative current amount controller NCC1 is turned on by the high-level temperature signal STS1.

As a result, the amount of current of the second current control signal CTRLS2 is increased. The second current control signal CTRLS2 is applied to the thermal sensor 220 of the temperature sensing unit 210 and controls a second current CTAT. If the amount of current of the second current control signal CTRLS2 is increased, the amount of current of the second current CTAT is increased, and if the amount of current of the second current control signal CTRLS2 is reduced, the amount of current of the second current CTAT is reduced.

As shown in FIG. 7, if the amount of current of the second current CTAT is increased, temperature of a position in which the second current CTAT intersects a first current PTAT, is increased. Since the position in which the second current CTAT intersects the first current PTAT is the reference temperature REFT, as the amount of current of the second current CTAT is increased, a new reference temperature REFT2 is increased than a previous reference temperature REFT1.

If the new reference temperature REFT2 is 90° C., the current temperature of the semiconductor device is 70° C. Thus, the comparator 230 outputs the temperature signal TS that has a low level. Then, the low-level temperature signal TS is stored in the second latch LT2.

The temperature signal STS stored in the second latch LT2 is referred to as STS2 for convenience. The temperature signal STS2 is applied to the first current control signal generating portion 610 and the second current control signal generating portion 620 of the controller 250.

If the second positive current amount controller PCC2 is a PMOS transistor, the transistor is turned on in response to the low-level temperature signal STS2. Differently, if the second negative current amount controller NCC2 is an NMOS transistor, the transistor is not affected by the low-level temperature signal STS2.

As a result, the amount of current of the first current control signal CTRLS1 is increased. The first current control signal CTRLS1 is applied to the thermal sensor 220 of the temperature sensing unit 210 and controls the first current PTAT. If the amount of current of the first current control signal CTRLS1 is increased, the first current level PTAT is increased, and if the amount of current of the first current control signal CTRLS1 is reduced, the first current level PTAT is reduced.

As shown in FIG. 8, if the first current level PTAT is increased, the temperature at which the first current PTAT intersects the second current CTAT is lowered. Since the position in which the first current PTAT intersects the second current CTAT is the reference temperature REFT, as the first current level PTAT is increased, a new reference temperature REFT2 is lowered compared to the previous reference temperature REFT1.

Only a case where the amount of current of the first current control signal CTRLS1 or the second current control signal CTRLS2 is increased has been described. However, in other embodiments, the amount of current of the first current control signal CTRLS1 or the second current control signal CTRLS2 may be reduced depending on the configuration of the circuit of the controller 250. And, a new reference temperature REFT will be set depending on the amount of current of the first current control signal CTRLS1 or the second current control signal CTRLS2.

Figure 9:
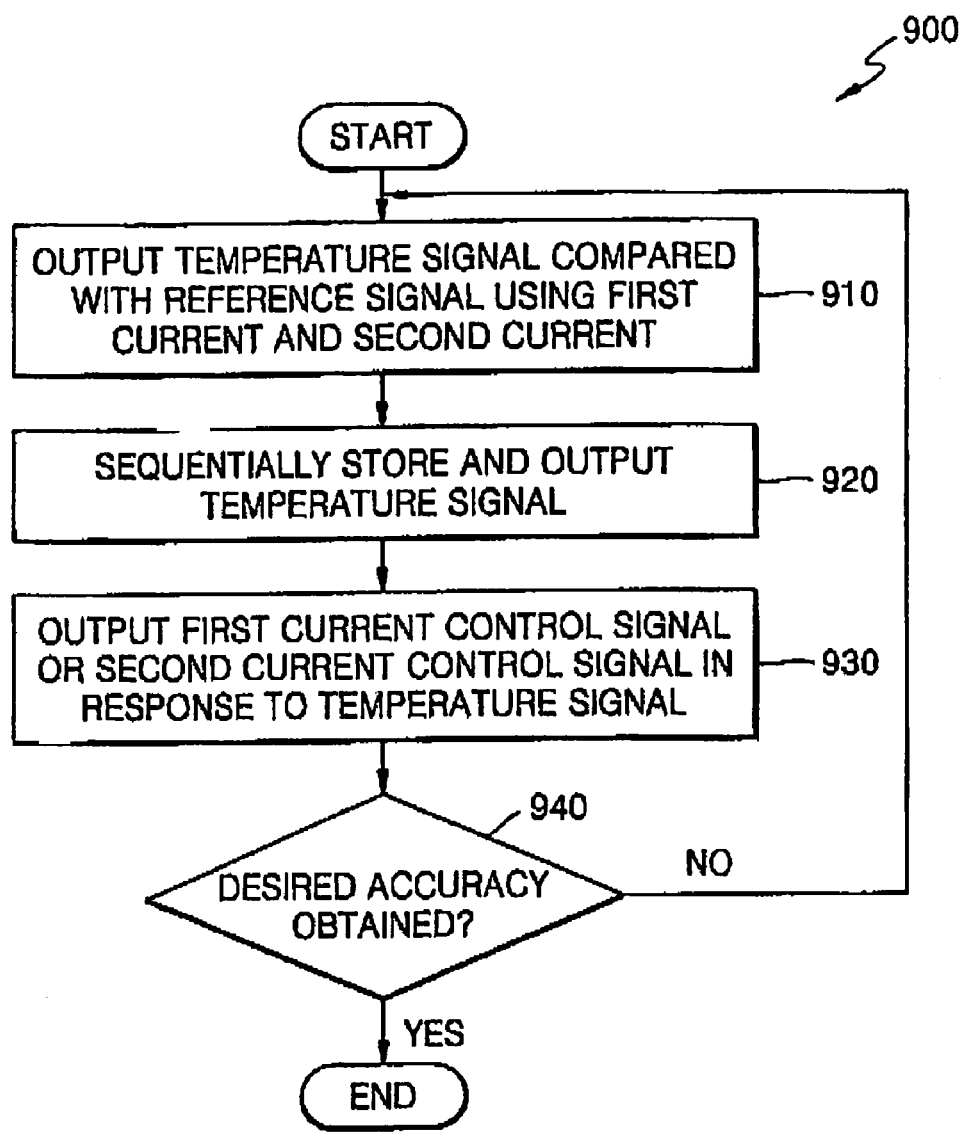
FIG. 9 is a flowchart illustrating a temperature sensing method according to another embodiment of the present invention.

FIG. 9 is a flowchart illustrating a temperature sensing method according to another embodiment of the invention. Referring to FIG. 9, a temperature sensing method can be performed by a flow 900 of the semiconductor device, first, a temperature signal having information on whether temperature in the semiconductor device is higher or lower than a reference temperature, is output using a first current and a second current (process 910).

Next, when the temperature signal is generated, the temperature signal is sequentially stored and output (process 920). Then, the first current control signal or the second current control signal is changed in response to the temperature signal that was output in process 920 (process 930).

Next, a decision is made based on the desired accuracy (process 940). If the desired accuracy is obtained, the flow ends. Otherwise, the flow returns to process 910.

Process 910 can correspond to the operation of the comparator 230 of the temperature sensing unit 210 of FIG. 2. Process 920 can correspond to the operation of the storage unit 240. Process 930 can correspond to the operations of the controller 250 and the thermal sensor 220 of the temperature sensing unit 210. Process 940 uses the processes 910 through 930 in an SAR algorithm. In other words, the temperature sensing flow 900 of FIG. 9 corresponds to the operation of the temperature sensing circuit 200 of FIG. 2, and thus, detailed descriptions thereof will be omitted.

In another embodiment, a circuit for controlling a self-refresh period of a dynamic random access memory (DRAM) according to temperature can be implemented with the temperature sensing unit 200.

The circuit for controlling the self-refresh period according to temperature has been implemented using existing thermal sensors. However, due to the limitation of existing thermal sensors that only a high level or a low level is output based on one reference temperature, the self-refresh period cannot be controlled accurately according to a range of temperatures.

In order to control the self-refresh period using the existing thermal sensor over a range of temperatures, several thermal sensors would be required.

Thus, by using the temperature sensing circuit according to embodiments of the invention, the self-refresh period can be controlled according to a range of temperatures by the digital signal output from the storage unit 240 of FIG. 2.

For example, when the storage unit 240 includes several latches, if the outputs of the latches are 0000000, the DRAM is designed to have a 0° C. self-refresh period. If the outputs of the latches are 1111111, the DRAM is designed to have a 127° C. self-refresh period.

As described above, in the temperature sensing circuit and the temperature sensing method according to embodiments of the invention, the temperature in a semiconductor device is accurately sensed, and the sensed result is output as a digital signal and can be used to control parameters changed according to the temperature in the semiconductor device, such as control of a self-refresh period according to temperature.

As described above, the invention can be practiced in many ways. What follows are descriptions of particular embodiments although there are, of course, many alternative embodiments.

According to one embodiment of the invention, a temperature sensing circuit for sensing the temperature in a semiconductor device includes a temperature sensing unit, a storage unit, and a controller.

The temperature sensing unit outputs a temperature signal having information about whether the temperature in the semiconductor device is higher or lower than a reference temperature in response to a first current control signal or a second current control signal by using a first current level that increases when the temperature rises and a second current level that reduces when the temperature rises.

The storage unit stores and outputs the temperature signal. The controller generates the first current control signal or the second current control signal used to control the reference temperature in response to the temperature signal output from the storage unit, thereby changing the first current level or the second current level.

The temperature sensing unit may include a temperature sensor and a comparator.

The thermal sensor increases or reduces the first current level in response to the first current control signal and increases or reduces the second current level in response to the second current control signal, thereby changing the reference temperature.

The comparator compares the first current and the second current output from the thermal sensor with each other and generates the temperature signal that has a first level or a second level.

The storage unit can include first through n-th latches which store the temperature signal, first through n-th transmission gates, which transmit the temperature signal to the first through n-th latches, and a gate controller.

The gate controller generates first through n-th gate control signals used to turn on or turn off the first through n-th transmission gates.

The temperature signal may be sequentially stored in the first through n-th latches whenever the temperature signal is output from the temperature sensing unit, and the first through n-th latches output the stored temperature signal to the controller sequentially.

In the first through n-th transmission gates, a previous transmission gate is turned on and turned off, and then, a next transmission gate is turned on. Activation periods of the first through n-th gate control signals do not overlap with one another.

The controller includes a first current control signal generating portion and a second current control signal generating portion. The first current control signal generating portion generates the first current control signal in response to the temperature signal output from the storage unit.

The second current control signal generating portion generates a second current control signal in response to the temperature signal output from the storage unit. The amount of current of the first current control signal and the second current control signal is increased or reduced in response to the temperature signal.

If the temperature signal has a first level, the amount of current of the first current control signal is reduced or the amount of current of the second current control signal is increased, and if the temperature signal has a second level, the amount of current of the first current control signal is increased or the amount of current of the second current control signal is reduced.

The first current control signal generating portion includes first through n-th positive current amount controlling parts for controlling the amount of current of the first current control signal in response to a corresponding temperature signal.

The second current control signal generating portion includes first through n-th negative current amount controlling parts for controlling the amount of current of the second current control signal in response to a corresponding temperature signal.

Each of the first through n-th positive current amount controlling parts may be a PMOS transistor that has a first end connected to a power supply, a gate to which the corresponding temperature signal is applied, and a second end through which the first current control signal is output.

Each of the first through n-th negative current amount controlling parts may be an NMOS transistor that has a first end connected to a power supply, a gate to which the corresponding temperature signal is applied, and a second end through which the second current control signal is output.

According to another aspect of the present invention, there is provided a method of sensing the temperature in a semiconductor device, the method including outputting a temperature signal having information on whether the temperature in the semiconductor device is higher or lower than a reference temperature using a first current and a second current; sequentially storing and outputting the temperature signal whenever the temperature signal is generated; generating the first current control signal or the second current control signal used to control the reference temperature; and changing the first current level or the second current level in response to the temperature signal previously output.

While this invention has been particularly shown and described with reference to a preferred embodiment thereof, it will be understood by those skilled in the art that various changes in form and details may be made therein without departing from the spirit and scope of the invention as defined by the appended claims.

What is claimed is:

1. A temperature sensing circuit for sensing a temperature in a semiconductor device, the circuit comprising:
    a temperature sensing unit structured to output a temperature signal indicating whether the temperature in the semiconductor device is higher or lower than a reference temperature in response to a first current control signal or a second current control signal by using a first current level that is increased when the temperature rises and a second current level that is reduced when the temperature rises;
    a storage unit structured to store the temperature signal and output the stored temperature signal; and
    a controller structured to generate the first current control signal or the second current control signal used to control the reference temperature, and to change the first current level or the second current level in response to the temperature signal output from the storage unit.

2. The circuit of claim 1, wherein the temperature sensing unit comprises:
    a thermal sensor structured to change the reference temperature by increasing or reducing the first current level in response to the first current control signal and by increasing or reducing the second current level in response to the second current control signal; and
    a comparator structured to compare the first current and the second current output from the thermal sensor to each other and to generate the temperature signal having a first level or a second level.

3. The circuit of claim 1, wherein the storage unit comprises:
    first through n-th latches for storing the temperature signal;
    first through n-th transmission gates for transmitting the temperature signal to the first through n-th latches; and
    a gate controller structured to generate first through n-th gate control signals used to turn on or turn off the first through n-th transmission gates.

4. The circuit of claim 3, wherein the temperature signal is sequentially stored in the first through n-th latches whenever the temperature signal is output from the temperature sensing unit, and the first through n-th latches output the stored temperature signal to the controller sequentially.

5. The circuit of claim 3, wherein in the first through n-th transmission gates, a previous transmission gate is turned on and turned off, and then, a next transmission gate is turned on.

6. The circuit of claim 3, wherein activation periods of the first through n-th gate control signals do not overlap with one another.

7. The circuit of claim 1, wherein the controller comprises:
    a first current control signal generating portion for generating the first current control signal with an amount of current in response to the stored temperature signal from the storage unit; and
    a second current control signal generating portion for generating the second current control signal with an amount of current in response to the stored temperature signal from the storage unit, wherein the amount of current of the first current control signal and the amount of current of the second current control signal is increased or reduced in response to the temperature signal.

8. The circuit of claim 7, wherein if the temperature signal has a first level, the amount of current of the first current control signal is reduced or the amount of current of the second current control signal is increased, and if the temperature signal has a second level, the amount of current of the first current control signal is increased or the amount of current of the second current control signal is reduced.

9. The circuit of claim 7, wherein the first current control signal generating portion further comprises first through n-th positive current amount controlling parts for controlling the amount of current of the first current control signal in response to the stored temperature signal, and the second current control signal generating portion includes first through n-th negative current amount controlling parts for controlling the amount of current of the second current control signal in response to the stored temperature signal.

10. The circuit of claim 9, wherein one or more of the first through n-th positive current amount controlling parts is a PMOS transistor that has a first end coupled to a power supply, a gate to which the corresponding temperature signal is applied, and a second end from which the first current control signal is output.

11. The circuit of claim 9, wherein one or more of the first through n-th negative current amount controlling parts is an NMOS transistor that has a first end coupled to a power supply, a gate to which the corresponding temperature signal is applied, and a second end from which the second current control signal is output.

12. A method of sensing a temperature in a semiconductor device, the method comprising:
   generating a temperature signal indicating whether the temperature in the semiconductor device is higher or lower than a reference temperature, the signal based on a first current and a second current;
   sequentially storing and outputting the temperature signal after the temperature signal is generated;
   changing the first current level or the second current level in response to outputting of the temperature signal; and
   generating the first current control signal or the second current control signal used to control the reference temperature.

13. The method of claim 12, wherein generating a temperature signal comprises:
   changing the first current level in response to the first current control signal and changing the second current level in response to the second current control signal, thereby changing the reference temperature; and
   comparing the first current to the second current and producing the temperature signal that has a first level or a second level.

14. The method of claim 12, wherein the first current level increases when the temperature rises, and the second current level reduces when the temperature rises.

15. A temperature sensing circuit for sensing a temperature in a semiconductor device, the circuit comprising:
   a temperature sensing unit having a first current control signal input, a second current control signal input, and a temperature signal output;
   a storage unit having a stored temperature signal output, the storage unit coupled to the temperature signal output; and
   a controller coupled to the first current control signal input, the second current control signal input, and the stored temperature signal output, the controller structured to change the first and second current control signal inputs based on the stored temperature signal output.

16. The circuit of claim 15 wherein the temperature sensing unit further comprises:
   a thermal sensor having at least two outputs and structured to receive the first and second control signal inputs; and
   a comparator structured to compare the at least two outputs of the thermal sensor and to generate the temperature signal output.

17. The circuit of claim 15 wherein the storage unit comprises:
   a plurality of latches, each latch structured to have an input and an output, the plurality of latch outputs forming the stored temperature signal output;
   a plurality of transmission gates, each gate structured to have an input, an output, and a control input, the gate outputs coupled to the latch inputs, the gate inputs coupled to the temperature signal output; and
   a gate controller having a plurality of control outputs, the gate controller control outputs coupled to the gate control inputs.

18. The circuit of claim 15 wherein the controller comprises:
   a first control signal generating portion coupled to the stored temperature signal output and the first current control signal input; and
   a second control signal generating portion coupled to the stored temperature signal output and the second current control signal input.

19. The circuit of claim 18 wherein the first control signal generating portion further comprises:
   a plurality of positive current amount controlling parts, each positive current amount controlling part coupled to a power supply, the stored temperature signal output, and the first current control signal input.

20. The circuit of claim 18 wherein the first control signal generating portion further comprises:
   a plurality of positive current sources, each positive current source coupled to a power supply; and
   a plurality of positive current amount controlling parts, each positive current amount controlling part coupled to the respective positive current source, the stored temperature signal output, and the first current control signal input.

21. The circuit of claim 18 wherein the second control signal generating portion further comprises:
   a plurality of negative current amount controlling parts, each negative current amount controlling part coupled to a power supply, the stored temperature signal output, and the second current control signal input.

22. The circuit of claim 18 wherein the second control signal generating portion further comprises:
   a plurality of negative current sources, each negative current source coupled to a power supply; and
   a plurality of negative current amount controlling parts, each negative current amount controlling part coupled to the respective positive current source, the stored temperature signal output, and the second current control signal input.

23. The circuit of claim 19 wherein the plurality of positive current amount controlling parts comprises a plurality of PMOS transistors.

24. The circuit of claim 21 wherein the plurality of negative current amount controlling parts comprises a plurality of NMOS transistors.

25. A method of sensing a temperature in a semiconductor comprising:
  generating a temperature signal from a comparison of a first and a second current;
  storing the temperature signal as a part of a stored temperature signal;
  changing either the first current or the second current, or both, based on the stored temperature signal; and
  repeatedly generating, storing, and changing, until either the first current or second current has been changed at least one time.

26. The method of claim 25 wherein changing the first current of the second current comprises:
  generating a first current control signal based on the stored temperature signal;
  generating a second current control signal based on the stored temperature signal;
  changing the first current based on the first current control signal and the temperature; and
  changing the second current based on the second current control signal and the temperature.

27. The method of claim 26 wherein changing the first current comprises changing the first current proportional to the temperature.

28. The method of claim 27 wherein changing the second current comprises changing the second current inversely proportional to the temperature.

29. The method of claim 26 wherein changing the second current comprises changing the second current proportional to the temperature.

30. The method of claim 29 wherein changing the first current comprises changing the first current inversely proportional to the temperature.

31. The method of claim 25 wherein, when the temperature is at a reference temperature, the first current is equal to the second current.

32. The method of claim 25 further comprising initializing the first and second currents to set the reference temperature at a value equal to an average of a temperature range.

33. The method of claim 25 wherein the semiconductor is a dynamic random access memory having a self refresh period.

34. The method of claim 33 further comprising changing the self refresh period based on the stored temperature.

* * * * *